(12) United States Patent
Joo et al.

(10) Patent No.: US 9,929,327 B2
(45) Date of Patent: Mar. 27, 2018

(54) LIGHT-EMITTING DEVICE PACKAGE AND LIGHT-EMITTING MODULE INCLUDING THE SAME

(71) Applicant: LG INNOTEK CO., LTD., Seoul (KR)

(72) Inventors: Yang Hyun Joo, Seoul (KR); Chang Hyuck Lee, Seoul (KR); Bo Ra Kang, Seoul (KR); Sung Phil Kim, Seoul (KR); Chang Gyun Son, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 146 days.

(21) Appl. No.: 14/944,397

(22) Filed: Nov. 18, 2015

(65) Prior Publication Data

US 2016/0138774 A1    May 19, 2016

(30) Foreign Application Priority Data

Nov. 19, 2014    (KR) .................. 10-2014-0161531

(51) Int. Cl.
| | |
|---|---|
| *F21V 9/16* | (2006.01) |
| *H01L 33/58* | (2010.01) |
| *H01L 33/54* | (2010.01) |
| *H01L 33/44* | (2010.01) |
| *H01L 33/50* | (2010.01) |
| *H01L 33/62* | (2010.01) |

(52) U.S. Cl.
CPC .............. *H01L 33/58* (2013.01); *H01L 33/54* (2013.01); *H01L 33/44* (2013.01); *H01L 33/50* (2013.01); *H01L 33/62* (2013.01); *H01L 2224/48091* (2013.01); *H01L 2224/8592* (2013.01); *H01L 2933/0083* (2013.01); *H01L 2933/0091* (2013.01)

(58) Field of Classification Search
CPC ......... H01L 33/58; H01L 33/54; H01L 33/44; H01L 33/50; H01L 33/62; H01L 2224/48091; H01L 2224/8592; H01L 2933/0083; H01L 2933/0091; H01L 2924/00014; F21K 9/50; F21K 9/56; F21V 9/16; G02F 2001/133614; G03B 21/204
USPC .......................................... 362/84, 240, 268
See application file for complete search history.

(56) References Cited

U.S. PATENT DOCUMENTS

| | | | | |
|---|---|---|---|---|
| 2011/0286200 | A1* | 11/2011 | Iimura .................... | F21V 7/041 362/84 |
| 2011/0292302 | A1* | 12/2011 | Park .................... | G02B 19/0071 348/739 |
| 2012/0092852 | A1* | 4/2012 | Doan ...................... | F21V 3/049 362/84 |

(Continued)

*Primary Examiner* — Elmito Breval
*Assistant Examiner* — Omar Rojas Cadima
(74) *Attorney, Agent, or Firm* — LRK Patent Law Firm

(57) ABSTRACT

Embodiments provide a light-emitting device package including a light source, a lens disposed on the light source, and a diffuser located on at least one of the interior of the lens or a light emission surface of the lens, so as to diffuse light. The diffuser includes at least one of a light dispersing agent distributed in the interior of the lens, or at least one light diffusion structure located on at least one of the outside or the inside of the light emission surface of the lens. The light diffusion structure includes a rough surface formed on the light emission surface of the lens.

17 Claims, 17 Drawing Sheets

(56) References Cited

U.S. PATENT DOCUMENTS

2012/0161621 A1\* 6/2012 Sato ..................... H01L 33/54
  313/512

\* cited by examiner

LIGHT-EMITTING DEVICE PACKAGE AND LIGHT-EMITTING MODULE INCLUDING THE SAME

CROSS REFERENCE TO RELATED APPLICATION

This application claims priority under 35 U.S.C. §119 to Korean Patent Application No. 10-2014-0161531, filed on Nov. 19, 2014, which is hereby incorporated in its entirety by reference as if fully set forth herein.

BACKGROUND OF THE INVENTION

1. Field of the Invention

Embodiments relate to a light-emitting device package and a light-emitting module including the same.

2. Description of Related Art

Semiconductor Light-Emitting Diodes (LEDs) are semiconductor devices that convert electricity into light such as infrared light using the characteristics of compound semiconductors so as to enable transmission/reception of signals, or that are used as a light source.

Group III-V nitride semiconductors are in the spotlight as core materials of light emitting devices such as, for example, LEDs or Laser Diodes (LDs) due to physical and chemical characteristics thereof.

The LEDs do not include environmentally harmful materials such as mercury (Hg) that are used in conventional lighting appliances such as, for example, fluorescent lamps and incandescent bulbs, and thus are very eco-friendly, and have several advantages such as, for example, long lifespan and low power consumption. As such, conventional light sources are being rapidly replaced with LEDs.

In a conventional light-emitting device package including LEDs, yellow light is emitted through the center of the upper surface thereof, whereas blue light is emitted through the corner between the upper surface and the side surface thereof, which may cause color deviation (or color separation). When an anisotropic secondary lens is applied to solve this problem, the characteristics of the light may be deteriorated and the manufacturing process may be complicated due to design difficulties and inferior fabrication technologies.

In particular, in the case of a conventional integrated type light-emitting device package in which a lens and a light-emitting device are in contact with each other, rather than being spaced apart from each other, an anisotropic aspheric lens is necessary, which may result in design difficulties and more serious color deviation.

SUMMARY

Embodiments provide a light-emitting device package capable of preventing color deviation and a light-emitting module including the same.

In one embodiment, a light-emitting device package includes a light source, a lens disposed on the light source, and a diffuser located on at least one of the interior of the lens or a light emission surface of the lens, so as to diffuse light, wherein the diffuser includes at least one of a light dispersing agent disposed to be distributed in the interior of the lens, or at least one light diffusion structure located on at least one of the outside or the inside of the light emission surface of the lens, and wherein the light diffusion structure includes a rough surface formed on the light emission surface of the lens.

For example, the rough surface may have a roughness within a range of 3 μm to 15 μm rms.

For example, the light diffusion structure may include at least one hole and at least one rod located at the light emission surface of the lens. The hole and the rod may be periodically arranged. The hole and the rod may be non-periodically arranged in a random manner. The at least one hole may include a plurality of holes having different depths, and the at least one rod includes a plurality of rods having different heights.

For example, the rod may have at least one shape selected from among a semispherical shape, a prism shape, a conical shape, a truncated shape, a polyhedral shape, a bar shape, and a lattice shape, or combinations thereof. The rod may have a height of 10 μm.

For example, the light diffusion structure may have a constant pattern or a random pattern. The light diffusion structure may be located on the light emission surface of at least one surface of an upper surface, a side surface, or a corner surface between the upper surface and the side surface of the lens.

For example, the light diffusion structure may be located on at least a portion of a side surface of the lens or the entire side surface of the lens, the entire side surface being the light emission surface.

For example, the light diffusion structure may be integrated with the lens and is a portion of the lens. Alternatively, the light diffusion structure may be attached or applied to the lens. The light diffusion structure may include a release film configured to be attachable to the light emission surface of the lens. Alternatively, the light diffusion structure may take the form of a sheet configured to be attachable to the light emission surface of the lens. Alternatively, the light diffusion structure may be attached to the light emission surface of the lens via spraying.

For example, the light-emitting device package may further include a fluorescent substance disposed on the light source. The fluorescent substance may be disposed to surround the light source, or may be disposed between a lower surface of the lens and the light source.

For example, the fluorescent substance may include a first fluorescent portion disposed between a first lower surface of the lens and an upper surface of the light source, a second fluorescent portion extending from the first fluorescent portion, the second fluorescent portion being disposed between a second lower surface of the lens and a side surface of the light source, and a third fluorescent portion extending from the second fluorescent portion, the third fluorescent portion being disposed under a third lower surface of the lens, and the lower surface of the lens may include the first, second, and third lower surfaces. The third fluorescent portion may be located so as to overlap the light diffusion structure in a vertical direction.

For example, the fluorescent substance and the lens may have the same width.

For example, the first to third fluorescent portions may have an even or uneven thickness.

For example, the lens may have a width different from a height thereof.

For example, the light source and the lens may come into contact with each other so as to be integrated with each other, or may be spaced apart from each other. The light source may be located in a recess formed in the lens.

For example, the light source may be located outside the lens.

For example, the light-emitting device package may further include first and second lead frames, and an insulator disposed between the first and second lead frames, so as to electrically insulate the first and second lead frames from each other.

For example, the light source may include a substrate, a first conductive semiconductor layer, an active layer, and a second conductive semiconductor layer, which are disposed on the substrate.

In another embodiment, a light-emitting module includes a module board, a plurality of light sources arranged on the module board, a plurality of lenses arranged respectively on the light sources, and a diffuser located on at least one of the interior or a light emission surface of the respective lens, so as to diffuse light, wherein the diffuser includes at least one of a light dispersing agent disposed, to be distributed in the interior of the lens or at least one light diffusion structure located on at least one of the outside or the inside of the light emission surface of the lens, and wherein the light diffusion structure includes a rough surface formed on the light emission surface of the lens.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
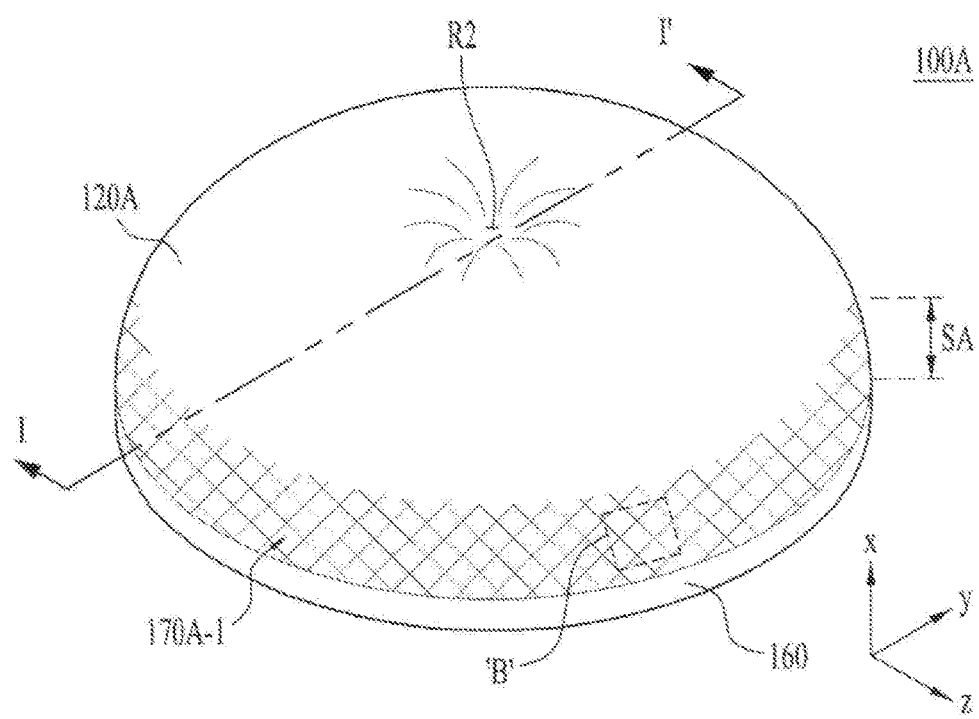
FIG. 1 is a perspective view of a light-emitting device package according to one embodiment.

Hereinafter, exemplary embodiments will be described in detail with reference to the accompanying drawings to aid in understanding of the embodiments. However, the embodiments may be altered in various ways, and the scope of the embodiments should not be construed as limited to the following description. The embodiments are intended to provide those skilled in the art with more complete explanation.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

In addition, the relative terms "first", "second", "upper", "lower" and the like in the description and in the claims may be used to distinguish between any one substance or element and other substances or elements and not necessarily for describing any physical or logical relationship between the substances or elements or a particular order.

In the drawings, the thickness or size of each layer (or each portion) may be exaggerated, omitted or schematically illustrated for clarity and convenience. In addition, the size of each constituent element does not wholly reflect an actual size thereof.

Hereinafter, light-emitting device packages according to the embodiments will be described with reference to the accompanying drawings. For convenience, although the light-emitting device packages and light-emitting modules having the same according to the embodiments will be described using the Cartesian coordinate system (comprising the x-axis, the y-axis, and the z-axis), of course, it may be described using other coordinate systems. In addition, although the x-axis, the y-axis, and the z-axis in the Cartesian coordinate system are perpendicular to one another, the embodiments are not limited thereto. That is, the x-axis, the y-axis, and the z-axis may cross one another, rather than being perpendicular to one another.

Figure 2:
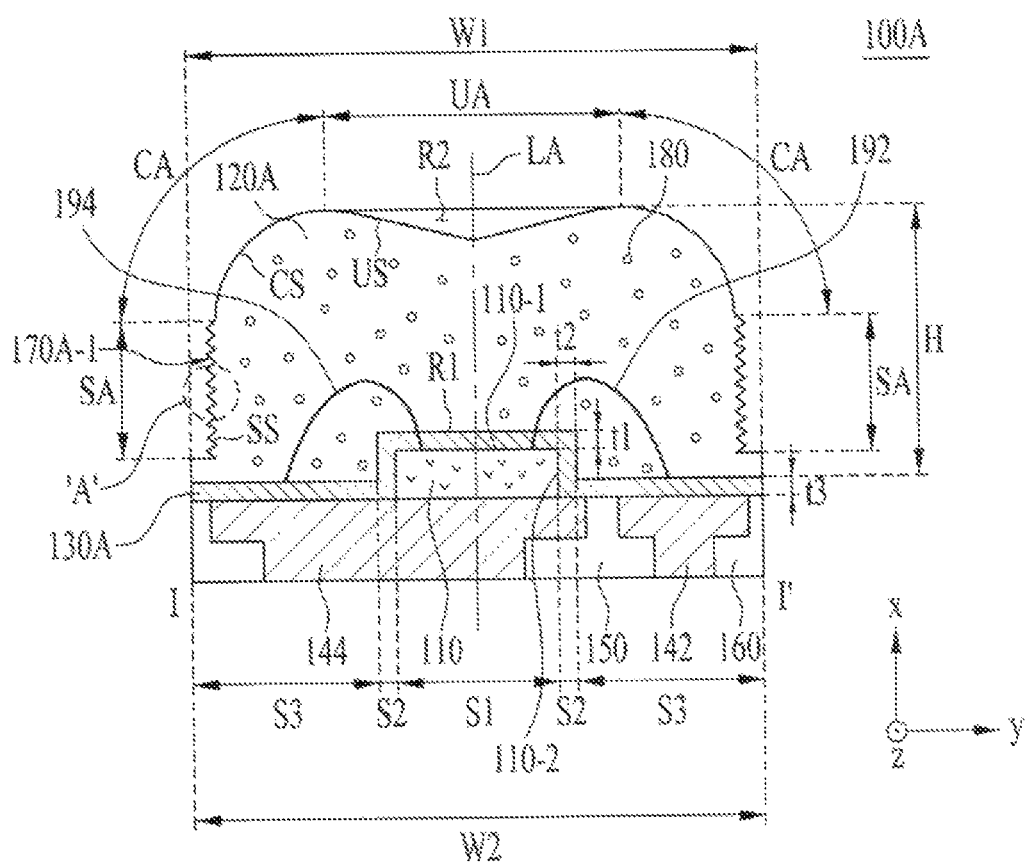
FIG. 2 is a sectional, view of the light-emitting device package taken along line I-I' illustrated in FIG. 1.

FIG. 1 is a perspective view of a light-emitting device package 100A according to one embodiment, and FIG. 2 is a sectional view of the light-emitting device package 100A taken along line I-I' illustrated in FIG. 1.

Referring to FIGS. 1 and 2, the light-emitting device package 100A according to the embodiment may include a light source 110, a lens 120A, a fluorescent substance (or a wavelength converter) 130A, first and second lead frames 142 and 144, an insulator 150, a package body 160, a diffuser, and wires 192 and 194. Here, the diffuser may include a light diffusion structure 170A-1 and a light dispersing agent 180.

The lens 120A may be disposed on the light source 110.

The light source 110 may be a light-emitting device chip. The light-emitting device chip may be a Light Emitting Diode (LED) chip, and the LED chip may be configured as a blue LED chip or an ultraviolet LED chip, or may be configured in the form of a package combining one or more of a red LED chip, a green LED chip, a blue LED chip, a yellow-green LED chip, and a white LED chip.

Hereinafter, various embodiments of the light-emitting device chip to form the light source 110 will be described with reference to the accompanying drawings.

Figure 3A:
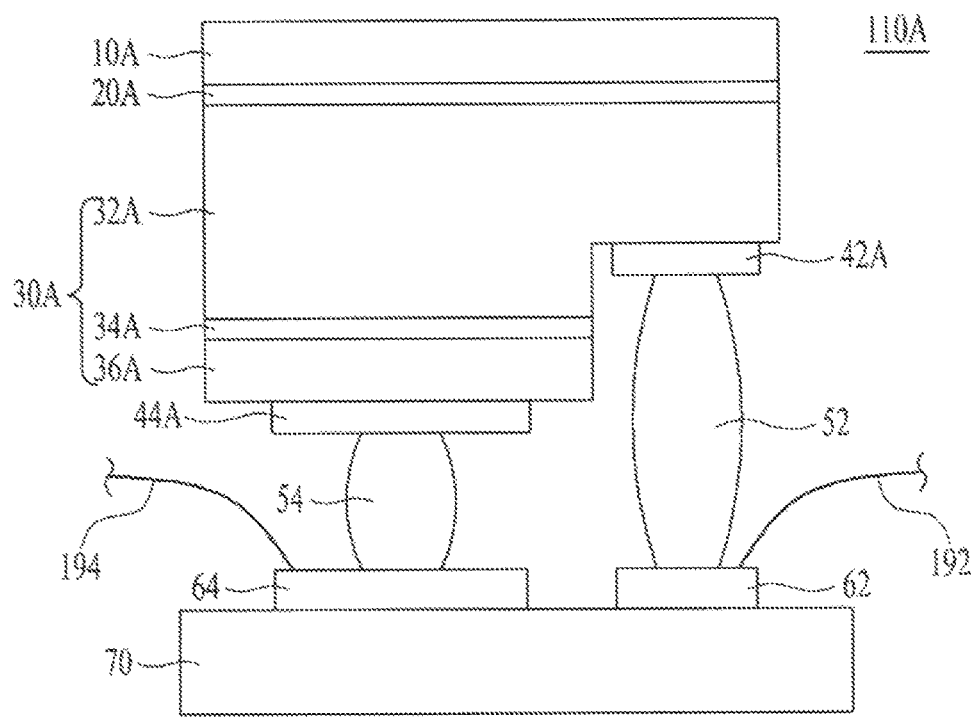
FIGS. 3A to 3C are sectional views of embodiments of a light source illustrated in FIG. 2.
Figure 3B:
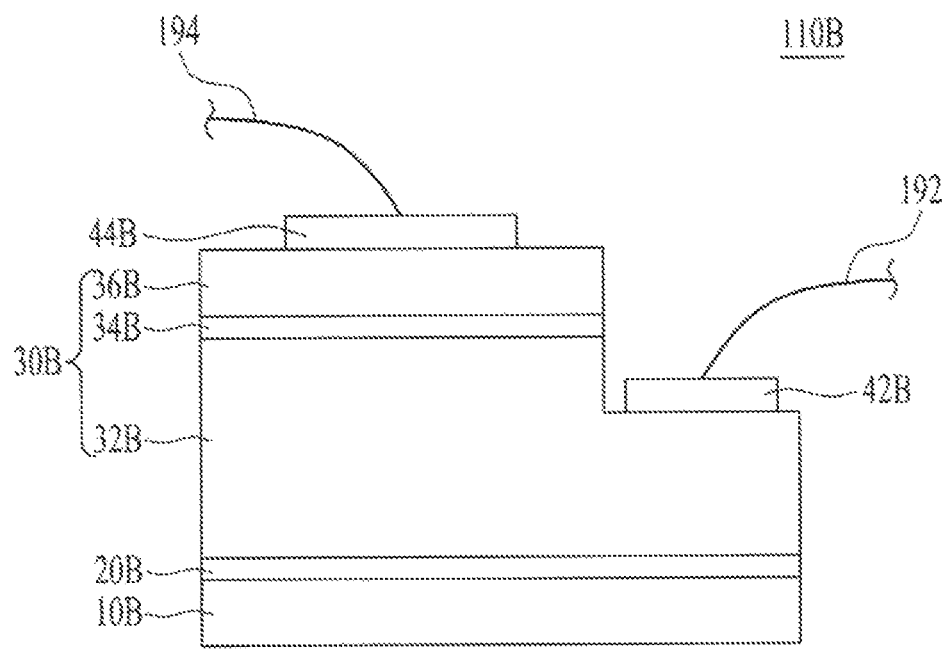
Figure 3C:
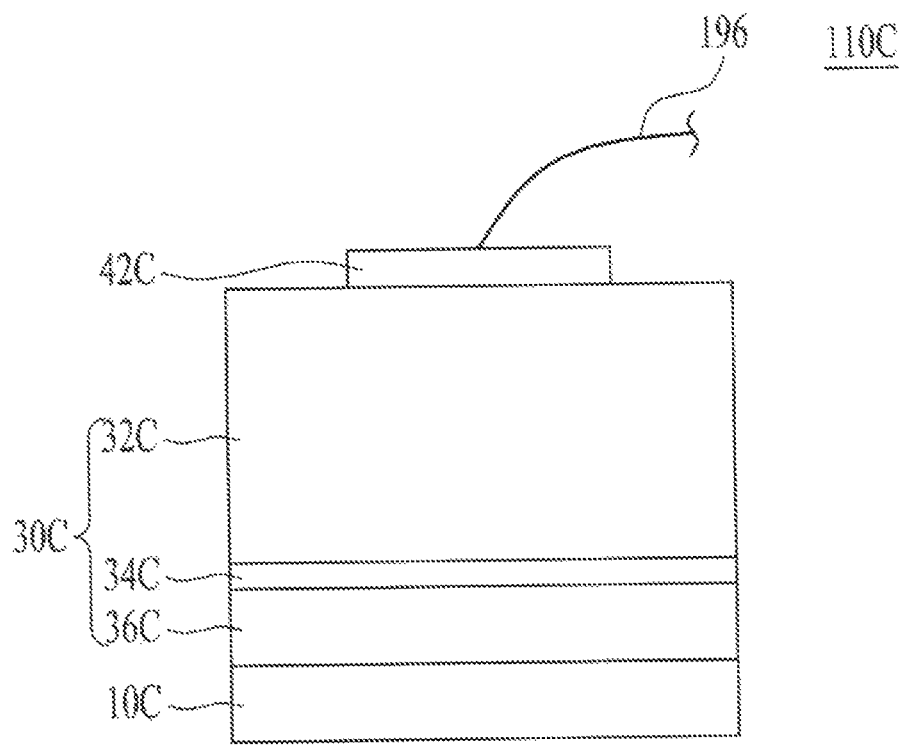

FIGS. 3A to 3C are sectional views of embodiments 110A, 110B and 110C of the light source 110 illustrated in FIG. 2.

The light-emitting device chip 110A having a flip bonding configuration illustrated in FIG. 3A may include a substrate 10A, a buffer layer 20A, a light-emitting structure 30A, first and second electrodes 42A and 44A, first and second bumps 52 and 54, first and second electrode pads (or metal layers) 62 and 64, and a sub-mount 70.

The substrate 10A may have light transmittance to allow light emitted from an active layer 34A to be emitted through the substrate 10A. For example, the substrate 10A may be formed of at least one of sapphire ($Al_2O_3$), SiC, GaAs, GaN, ZnO, Si, GaP, InP, or Ge, without being limited thereto. In addition, the substrate 10A may have mechanical strength to ensure appropriate separation of chips via scribing or breaking without causing the bending of entire nitride semiconductors.

The buffer layer 20A is disposed between the substrate 10A and the light-emitting structure 30A, and serves to improve lattice-matching between the substrate 10A and the light-emitting structure 30A. For example, the buffer layer 20A may include AlN or undoped nitride, without being limited thereto. The buffer layer 20A may be omitted according to the kind of the substrate 10A or the kind of the light-emitting structure 30A.

The light-emitting structure 30A may be disposed below the buffer layer 20A, and may be formed by sequentially stacking a first conductive semiconductor layer 32A, the active layer 34A, and a second conductive semiconductor layer 36A one above another.

The first conductive semiconductor layer 32A may be disposed between the buffer layer 20A and the active layer 34A and may be formed of compound semiconductors. The first conductive semiconductor layer 32A may be formed of, for example, group III-V or II-V compound semiconductors and may be doped with a first conductive dopant. For example, the first conductive semiconductor layer 32A may be formed of a semiconductor material having a composition of $Al_xIn_yGa_{(1-x-y)}N$ ($0 \le x \le 1$, $0 \le y \le 1$, $0 \le x+y \le 1$), i.e. any one or more materials selected from among InAlGaN, AlGaAs, GaP, GaAs, GaAsP, and AlGaInP. When the first conductive semiconductor layer 32A is an n-type semiconductor layer, the first conductive dopant may include an n-type dopant such as, for example, Si, Ge, Sn, Se, and Te. The first conductive semiconductor layer 32A may be formed in a single layer or multiple layers, without being limited thereto.

When the light-emitting device chip 110A illustrated in FIG. 3A emits light in a ultraviolet (UV) wavelength band, more particularly, a deep UV (DUV) wavelength band, the first conductive semiconductor layer 32A may be formed of at least one of InAlGaN or AlGaN, which absorbs a smaller amount of light in a UV wavelength band than GaN.

The active layer 34A may be disposed between the first conductive semiconductor layer 32A and the second conductive semiconductor layer 36A, and may have any one structure selected from among a single-well structure, a multi-well structure, a single-quantum well structure, a multi-quantum well structure, a quantum dot structure, and a quantum wire structure. The active layer 34A may include a well layer and a barrier layer having a pair structure of any one or more of InGaN/GaN, InGaN/InGaN, GaN/AlGaN, InAlGaN/GaN, GaAs(InGaAs)/AlGaAs, and GaP(InGaP)/AlGaP, by using group III-V compound semiconductors, without being limited thereto. The well layer may be formed of a material having lower band gap energy than the band gap energy of the barrier layer.

The second conductive semiconductor layer 36A may be disposed under the active layer 34A. The second conductive semiconductor layer 36A may be formed of compound semiconductors. The second conductive semiconductor layer 36A may be formed of, for example, group III-V or II-VI compound semiconductors, and may be doped with a second conductive dopant. For example, the second conductive semiconductor layer 36A may be formed of a semiconductor material having a composition of $In_xAl_yGa_{1-x-y}N$ ($0 \le x \le 1$, $0 \le y \le 1$, $0 \le x+y \le 1$), or may be formed of any one or more selected from among AlInN, AlGaAs, GaP, GaAs, GaAsP, and AlGaInP. When the second conductive semiconductor layer 36A is a p-type semiconductor layer, the second conductive dopant may be a p-type dopant such as, for example, Mg, Zn, Ca, Sr, or Ba.

When the light-emitting device chip 110A illustrated in FIG. 3A emits light in a UV (more particularly, DUV) wavelength band, the light in a UV (more particularly, DUV) wavelength band may be absorbed by GaN, which causes a reduction in light extraction efficiency. Therefore, the second conductive semiconductor layer 36A may comprise at least one of InAlGaN or AlGaN. However, since the efficient injection of holes through the second electrode 44A may be not performed when the second conductive semiconductor layer 36A is formed of only InAlGaN or AlGaN, the second conductive semiconductor layer 36A may further comprise GaN.

Next, the first electrode 42A is disposed under the first conductive semiconductor layer 32A. The first electrode 42A may comprise at least one of AlN or BN, for example, without being limited thereto. That is, the first electrode 42A may be formed of any material so long as it reflects or transmits the light emitted from the active layer 34A, rather than absorbing the light, and may be grown at high quality on the first conductive semiconductor layer 32A.

In addition, the first electrodes 42A may comprise an ohmic contact material and serve as an ohmic layer. Thus, a separate ohmic layer (not illustrated) may be unnecessary, or a separate ohmic layer may be disposed under the first electrodes 42A.

In addition, the second electrode 44A may be in contact with the second conductive semiconductor layer 36A and may be formed of a metal. For example, the second electrode 44A may be formed of Ag, Ni, Al, Rh, Pd, Ir, Ru, Mg, Zn, Pt, Au, Hf, and selective combinations thereof.

The second electrode 44A may be a Transparent Conductive Oxide (TCO) film. For example, the second electrode 44A may comprise the above metal material and at least one of Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni/IrOx/Au, or Ni/IrOx/Au/ITO, and is not limited to these materials. The second electrode 44A may comprise a material for ohmic contact with the second conductive semiconductor layer 36A.

In addition, the second electrode 44A may be formed in a single layer or multiple layers through the use of a reflective electrode material having ohmic characteristics. When the second electrode 44A serves as an ohmic layer, a separate ohmic layer (not illustrated) may be omitted.

In succession, referring to FIG. 3A, the sub-mount 70 may be configured as a semiconductor substrate formed of, for example, AlN, BN, SiC, GaN, GaAs, or Si, without being limited thereto. The sub-mount 70 may be formed of a semiconductor material having good thermal conductivity. In addition, an Electro Static Discharge (ESD) protection element in the form of a Zener diode may be included in the sub-mount 70.

The first electrode 42A may be connected to the first electrode pad 62 on the sub-mount 70 via the first bump 52, and the second electrode 44A may be connected to the second electrode pad 64 on the sub-mount 70 via the second bump 54. The first and second wires 192 and 194 may be electrically connected respectively to the first and second lead frames 142 and 144 illustrated in FIG. 2. That is, the first electrode pad 62 may be electrically connected to the first lead frame 142 via the first wire 192, and the second electrode pad 64 may be electrically connected to the second lead frame 144 via the second wire 194.

Although not illustrated, a first upper bump metal layer (not illustrated) may further be disposed between the first electrode 42A and the first bump 52, and a first lower bump metal layer (not illustrated) may further be disposed between the first electrode pad 62 and the first bump 52. Here, the first upper bump metal layer and the first lower bump metal layer serve to indicate the position at which the first bump 52 must be positioned. Similarly, a second upper bump metal layer (not illustrated) may further be disposed between the second electrode 44A and the second bump 54, and a second lower bump metal layer (not illustrated) may further be disposed between the second electrode pad 64 and the second bump 54. Here, the second upper bump metal layer and the second lower bump metal layer serve to indicate the position at which the second bump 54 must be positioned.

When the sub-mount 70 is formed of a material having electrical conductivity such as Si, unlike the illustration of FIG. 3A, a protective layer (not illustrated) may further be disposed between the first and second electrode pads 62 and 64 and the sub-mount 70. Here, the protective layer may be formed of an insulation material. However, when the sub-mount 70 is formed of an electrical insulation material, it is unnecessary to dispose the protective layer as illustrated in FIG. 3A.

Next, a light-emitting device chip 110B illustrated in FIG. 3B has a horizontal bonding structure, and therefore does not require the first and second bumps 52 and 54, the first and second electrode pads 62 and 64, and the sub-mount 70 illustrated in FIG. 3A. Except for this difference, the light-emitting device chip 110B illustrated in FIG. 3B is the same as the light-emitting device chip 110A illustrated in FIG. 3A, and thus a detailed description of the same configuration will be omitted below. That is, a substrate 10B, a buffer layer 20B, a light-emitting structure 30B, and first, and second electrodes 42B and 44B illustrated in FIG. 3B respectively perform the same functions as the substrate 10A, the buffer layer 20A, the light-emitting structure 30A, and the first and second electrodes 42A and 44A illustrated in FIG. 3A. Thus, a first conductive semiconductor layer 32B, an active layer 34B, and a second conductive semiconductor layer 36B illustrated in FIG. 3B respectively perform the same functions as the first conductive semiconductor layer 32A, the active layer 34A, and the second conductive semiconductor layer 36A illustrated in FIG. 3A.

In addition, since the light-emitting device chip 110A illustrated in FIG. 3A has a flip bonding structure, light emitted from the active layer 34A is directed to pass through the first conductive semiconductor layer 32A, the buffer layer 20A, and the substrate 10A. Thus, the first conductive semiconductor layer 32A, the buffer layer 20A, and the substrate 10A may be formed of a transmissive material.

On the other hand, since the light-emitting device chip 110B illustrated in FIG. 3B has a horizontal bonding structure, light emitted from the active layer 34B is directed to pass, through the second conductive semiconductor layer 36B and the second electrode 44B. To this end, the second conductive semiconductor layer 36B and the second electrode 44B illustrated in FIG. 3B may be formed of a transmissive material, and the first conductive semiconductor layer 32B, the buffer layer 20B, and the substrate 10B may be formed of a transmissive or non-transmissive material.

Next, a light-emitting device chip 110C having a vertical bonding structure illustrated in FIG. 3C includes a support substrate 10C, a light-emitting structure 30C, and a first electrode 42C.

The support substrate 10C may comprise a conductive material or a non-conductive material. For example, the support substrate 10C may comprise at least one selected from among sapphire ($Al_2O_3$), GaN, SiC, ZnO, GaP, InP, $Ga_2O_3$, GaAs, and Si, without being limited thereto. When the support substrate 10C is a conductive substrate, the entire support substrate 10C may serve as a second electrode (e.g., a p-type electrode), and therefore, may be formed of a metal having high electric conductivity. In addition, the support substrate 10C may be formed of a metal having high thermal conductivity because it has to sufficiently dissipate heat generated during operation of a light-emitting device.

For example, the support substrate 10C may be formed of a material selected from the group of molybdenum (Mo), silicon (Si), tungsten (W), copper (Cu) and aluminum (Al), or alloys thereof. In addition, the support substrate 10C may selectively include gold (Au), copper (Cu) alloy, nickel (Ni), copper-tungsten (Cu—W), carrier wafer (e.g., GaN, Si, Ge, GaAs, ZnO, SiGe, SIC, SiGe, and $Ga_2O_3$).

Although not illustrated, a reflective layer (not illustrated) may further be disposed between the support substrate 10C and the second conductive semiconductor layer 36C. The reflective layer may serve to upwardly reflect light emitted from an active layer 34C. For example, the reflective layer may be configured as a metal layer comprising aluminum (Al), silver (Ag), nickel (Ni), platinum (Pt), rhodium (Rh), or alloys including Al, Ag, Pt, or Rh. Aluminum, silver or the like may effectively reflect the light emitted from the active layer 34C, thereby considerably improving the light extraction efficiency of a light-emitting device.

In FIG. 3C, the light emitted from the active layer 34C is directed to pass through a first conductive semiconductor layer 32C and the first electrode 42C. To this end, the first conductive semiconductor layer 32C and the first electrode 42C may be formed of a transmissive material, and the second conductive semiconductor layer 36C may be formed of a transmissive or non-transmissive material. In addition, since the light-emitting device chip 110C illustrated in FIG. 3C has a vertical bonding structure, it does not require the first and second bumps 52 and 54, the first and second electrode pads 62 and 64, and the sub-mount 70 illustrated in FIG. 3A. Except for this difference, the light-emitting device chip 110C illustrated in FIG. 3C is the same as the light-emitting device chip 110A illustrated in FIG. 3A, and thus a detailed description of the same configuration will be omitted below. That is, the light-emitting structure 30C and the first electrode 42C illustrated in FIG. 3C respectively perform the same functions as the light-emitting structure 30A and the first electrode 42A illustrated in FIG. 3A, and the first conductive semiconductor layer 32C, the active layer 34C, and the second conductive semiconductor layer 36C of the light-emitting structure 30C illustrated in FIG. 3C respectively correspond to and respectively perform the same functions as the first conductive semiconductor layer 32A, the active layer 34A, and the second conductive semiconductor layer 36A illustrated in FIG. 3A.

Meanwhile, referring again to FIG. 2, the first and second lead frames 142 and 144 may be spaced apart from each other. At this time, the insulator 150 may be disposed between the first and second lead frames 142 and 144, and serve to electrically insulate the first and second lead frames 142 and 144 from each other.

As exemplarily illustrated in FIG. 2, although the first and second lead frames 142 and 144 may be embedded, as separate members, in the package body 160, embodiments are not limited thereto.

In another embodiment, when the package body 160 is formed of an aluminum material having electric conductivity, the first and second lead frames 142 and 144 may respectively correspond to first and second body portions which constitute a portion of the package body 160 and which are spaced apart from each other. In this case, the insulator 150 is disposed between the first and second body portions 142 and 144 and serves to electrically insulate the two 142 and 144 from each other.

In FIG. 2, although the light source 110 is illustrated as being disposed on the second lead frame 144, embodiments are not limited thereto. That is, the light source 110 may be disposed on the first lead frame 142, instead of the second lead frame 144.

Figure 4:
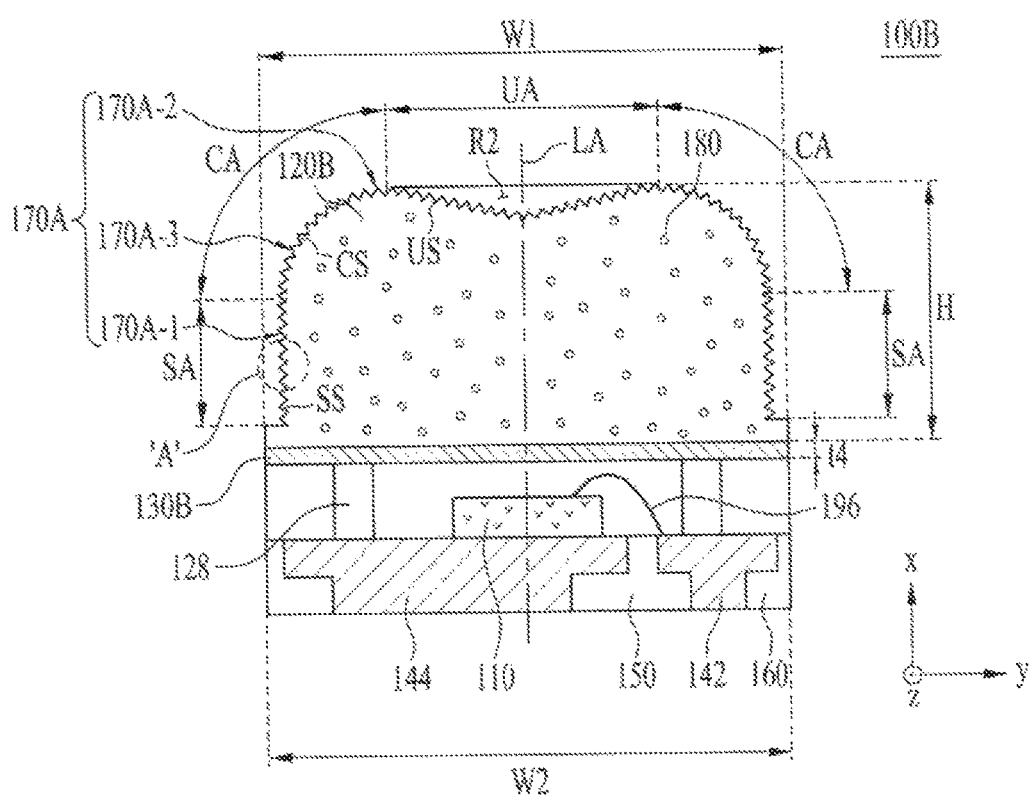
FIG. 4 is a sectional view of a light-emitting device package according to another embodiment.

FIG. 4 is a sectional view of a light-emitting device package 100B according to another embodiment.

The light-emitting device package 100B illustrated in FIG. 4 may include a light source 110, a lens 120B, a lens support part 128, a fluorescent substance (or a wavelength converter) 130B, first and second lead frames 142 and 144, an insulator 150, a package body 160, a light diffusion structure 170A-1, a light dispersing agent 180, and a wire 196. Here, the light source 110, the first and second lead frames 142 and 144, the insulator 150, the package body 160, and the light dispersing agent 180 respectively correspond to and are respectively the same as the light source 110, the first and second lead frames 142 and 144, the insulator 150, the package body 160, and the light dispersing agent 180 illustrated in FIG. 2, and thus are designated by the same reference numerals, and a repeated description thereof will be omitted below.

In FIG. 4, the lens support part 128 may be shaped to protrude from the lower surface of the lens 120B to the package body 160, or may be shaped to protrude from the upper part (or, top) of the package body 160 to the lens 120B.

In the case of the light-emitting device package 100A illustrated in FIGS. 1 and 2, although the light source 110 is illustrated as coming into contact with and being integrated with the lens 120A, embodiments are not limited thereto. That is, in another embodiment, as exemplarily illustrated in FIG. 4, the light source 110 and the lens 120B may be disposed to be separately spaced apart from each other.

Hereinafter, only components of the light-emitting device package 100B illustrated in FIG. 4, which are different from those of the light-emitting device package 100A illustrated in FIG. 2, will be described, and a description related to the same components will be omitted. To this end, the same components as those of FIG. 2 are designated by the same reference numerals.

In addition, the light source 110 may be disposed in, a first recess R1 formed in the lens 120A as exemplarily illustrated in FIG. 2, or may be disposed under the outside of the lens 120B as exemplarily illustrated in FIG. 4. That is, the lower surface of the lens 120A may have an indented cross-sectional shape to form the first recess R1 as exemplarily illustrated in FIG. 2, or may have a flat cross-sectional shape as exemplarily illustrated in FIG. 4.

In addition, the lenses 120A and 120B illustrated in FIGS. 2 and 4 may include, as a light emission surface, at least one of a side surface SS of a side area SA, an upper surface US of an upper area UA, or a corner surface CS of a corner area CA. Here, the corner surface CS may be defined as a surface between the upper surface US and the side surface SS, and the light emission surface may mean the surface through which the light from the lens 120A or 120B is emitted.

The lenses 120A and 120B may comprise at least one transparent material such as, for example, silicon, polycarbonate (PC), poly(methylmethacrylate) (PMMA), or glass, and embodiments are not limited as to the material of the lenses 120A and 120B. In addition, the lenses 120A and 120B may have a spherical or aspherical surface, and embodiments are not limited as to the shape of the lenses 120A and 120B. For example, as exemplarily illustrated in FIGS. 2 and 4, a second recess R2 may be formed in the top surface of the lens 120A or 120B. Here, as exemplarily illustrated in FIGS. 2 and 4, the top surface of the lens 120A or 120B, in which the second recess R2 is formed, may include the upper surface US of the upper area UA, or may include a portion of the corner surface CS of the corner area CA and the upper surface US of the upper area UA. At this time, although the lowermost point of the second recess R2 may pass through the light axis LA, embodiments are not limited thereto.

In addition, as exemplarily illustrated in FIGS. 2 and 4, the lens 120A or 120B may have the first width W1 and the height H, which are different from each other. The first width W1 may mean the width of the lens 120A or 120B in the direction (e.g. the y-axis perpendicular to the light axis LA) crossing the light axis LA. Here, although the height H of the lens 120A or 120B may be 1 mm, embodiments are not limited thereto. For example, the first width W1 may be greater than the height H. This is because the lens 120A or 120B may diffuse light in various ways without a diffuser when the lens 120A or 120B has the same first width W1 as the height H of the side surface SS.

In one embodiment, the diffuser may include the light dispersing agent 180 disposed with being distributed in the lens 120A or 120B. The light dispersing agent 180 serves to diffuse light when light emitted from the fluorescent substance 130A or 130B is emitted from the light emission surface US, CS or SS. To this end, although the light dispersing agent 180 may be, for example, a silicon-based, acryl-based, or calcium carbonate-based dispersing agent, and may comprise $TiO_2$, embodiments are not limited as to the material of the light dispersing agent 180.

In addition, to perform the above-described role, the diffuser may further include at least one light diffusion structure located at the exterior or the interior of the light emission surface US, SS or CS of the lens 120A or 120B. In the cases of FIGS. 2 and 4, although the light diffusion structure 170A-1 or 170A is illustrated as being located at the exterior of the lens 120A or 120B, embodiments are not limited thereto. Unlike the illustration, the light diffusion structure 170A-1 or 170A may be located at the interior of the lens 120A or 120B.

Hereinafter, the position and shape of the light diffusion structure will be described with reference to the accompanying drawings.

Figure 5:
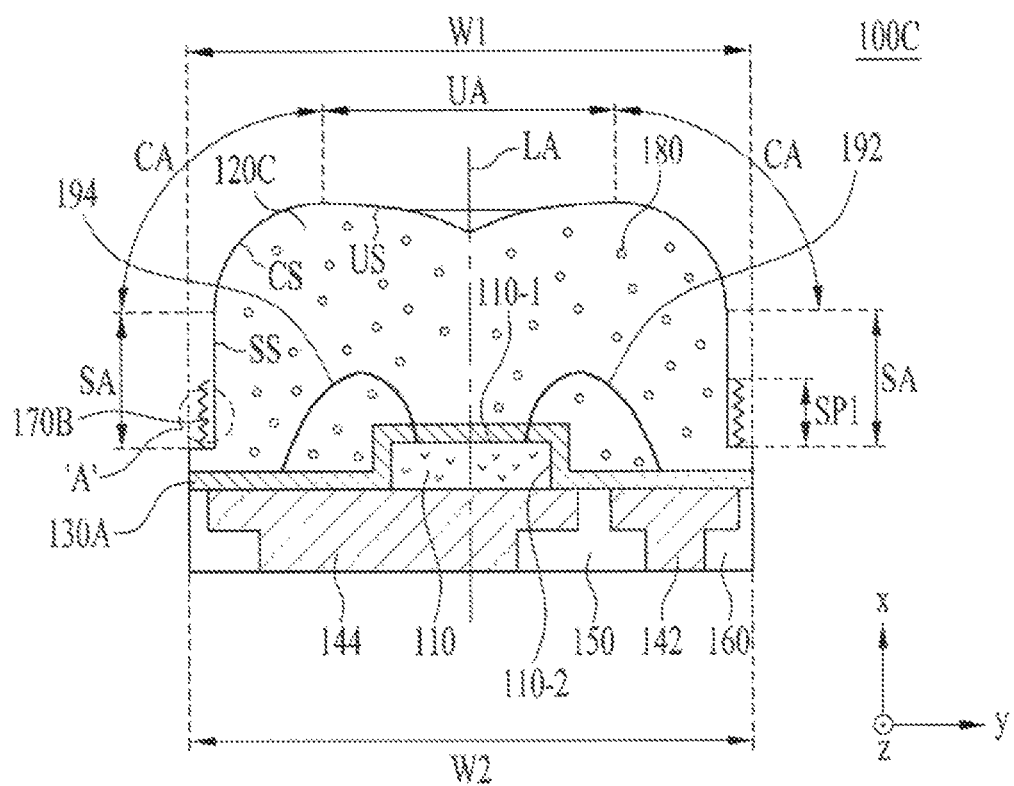
FIG. 5 is a sectional view of a light-emitting device package according to another embodiment.

FIG. 5 is a sectional view of a light-emitting device package 100C according to another embodiment.

The light-emitting device package 100C illustrated in FIG. 5 may include a light source 110, a lens 120C, a fluorescent substance 130A, first and second lead frames 142 and 144, an insulator 150, a package body 160, a light diffusion structure 170B, a light dispersing agent 180, and wires 192 and 194. Here, the light source 110, the lens 120C, the fluorescent substance 130A, the first and second lead frames 142 and 144, the insulator 150, the package body 160, the light diffusion structure 170B, the light dispersing agent 180 and the wires 192 and 194 respectively perform the same functions as the light source 110, the lens 120A, the fluorescent substance 130A, the first and second lead frames 142 and 144, the insulator 150, the package body 160, the light diffusion structure 170A-1, the light dispersing agent 180, and the wires 192 and 194 illustrated in FIG. 2. However, with regard to the shape and/or the size, the light diffusion structure 170B and the second recess R2 illustrated in FIG. 5 may be different from the light diffusion structure 170A-1 and the second recess R2 respectively.

In addition, the light diffusion structure may be located at the light emission surface, i.e. at least one surface of the upper surface US, the side surface SS, or the corner surface CS of the lens 120A, 120B or 120C. For example, as exemplarily illustrated in FIG. 2 or 5, the light diffusion structure 170A-1 or 170B may be located at only the side surface SS of the lens 120A or 120C. Alternatively, as exemplarily illustrated in FIG. 4, the light diffusion structure 170A may include a first light diffusion structure 170A-1 located at the side surface SS of the lens 120B, a second light diffusion structure 170A-2 located at the upper surface US of the lens 120B, and a third light diffusion structure 170A-3 located at the corner surface CS of the lens 120B. Although not illustrated, the light diffusion structure 170A may include only the first and second light diffusion structures 170A-1 and 170A-2, or may include only first and third light diffusion structures 170A-1 and 170A-3. As such, the light diffusion structure 170A may essentially include the first light diffusion structure 170A-1, and may additionally include at least one of the second or third light diffusion structures 170A-2 and 170A-3.

In addition, the light diffusion structure 170A-1 may be located at the entire side surface SS of the lens 120A as exemplarily illustrated in FIG. 2, and the light diffusion structure 170B may be located at a portion of the side surface SS of the lens 120C as exemplarily illustrated in FIG. 5.

In addition, as exemplarily illustrated in FIGS. 2 and 4, the light diffusion structure 170A-1 or 170A may be integrated with the lens 120A or 120B, and may constitute a portion of the lens 120A or 120B. That is, the light diffusion structure 170A may be directly formed on the light emission surface of the lens 120A or 120B. In this case, the light diffusion structure may be mechanically or chemically formed on the light emission surface of the lens 120A or 120B.

Alternatively, as exemplarily illustrated in FIG. 5, the light diffusion structure 170E may be a separate member attached to or applied (or deposited) to the lens 120C. For example, in a state in which a release film is disposed on a mold, the release film may be attached to the light emission surface (e.g., SS in FIG. 5) of the lens 120C. As such, the light diffusion structure may be fabricated so as to be inserted into the release film that is used to release the lens 120. That is, the light diffusion structure 170B may include the release film having the light diffusion structure.

Alternatively, the light diffusion structure 170B may take the form of a sheet that is attachable to the light emission surface (e.g. SS in FIG. 5) of the lens 120C. Alternatively, the light diffusion, structure 170B may be applied to the light emission surface (e.g., SS in FIG. 5) of the lens 120C via spraying. The light diffusion structure 170B may be located on at least one of the upper surface US, the side surface SS, or the corner surface CS of the lens 120C in various ways.

In addition, when the light source 110 is the flip bonding type light-emitting device chip 110A as exemplarily illustrated in FIG. 3A or the horizontal bonding, type light-emitting device chip 110B as exemplarily illustrated in FIG. 3B, the first conductive semiconductor layer 32A or 32B may be electrically connected to the first lead frame 142 via the first wire 192 and the second conductive semiconductor layer 36A or 36B may be electrically connected to the second lead frame 144 via the second wire 194. However, embodiments are not limited thereto. That is, when the light source 110 has a flip bonding structure, the sub-mount 70 and the first and second electrode pads 62 and 64 illustrated in FIG. 3A may be omitted, and the first and second bumps 52 and 54 may be directly connected to the first and second lead frames 142 and 144 respectively.

In addition, when the light source 110 is the vertical bonding type light-emitting device chip 110C as illustrated in FIG. 3C, the first conductive semiconductor layer 32C may be electrically connected to the first lead, frame 142 via the wire 196, and the second conductive semiconductor layer 36C may be electrically connected to the second lead frame 144 via the support substrate 10C.

Hereinafter, the light diffusion structure to constitute the diffuser will be described with reference to the accompanying drawings.

In addition, according to one embodiment, the light diffusion structure 170A-1, 170A and/or 170B may include a rough surface (or, roughness surface) formed on the light emission surface US, CS, and SS of the lens 120A, 120B, or 120C. Here, the rough surface may have a roughness within a range from 3 μm to 15 μm rms in consideration of a process margin. Here, the roughness of the rough surface may be selected in various ways according to the size of the lens 120A, 120B or 120C.

Figure 6A:
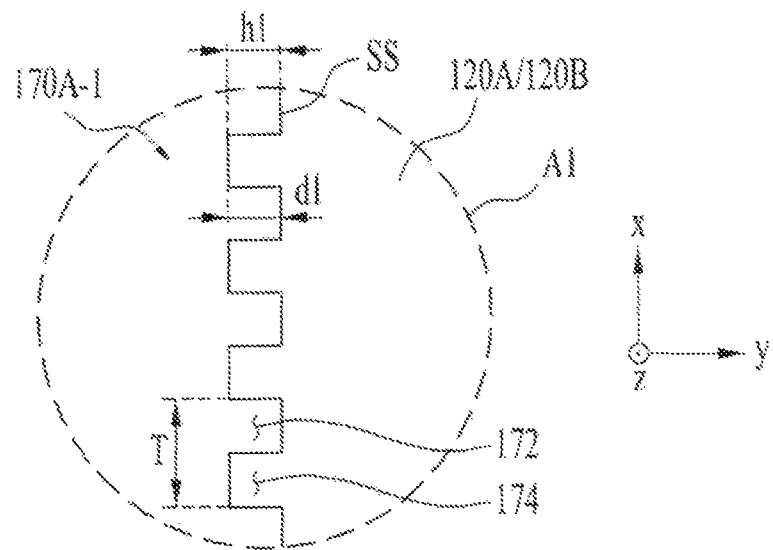
FIGS. 6A to 6C are partial enlarged sectional views illustrating embodiments of portion "A" illustrated in FIGS. 2, 4 and 5.
Figure 6B:
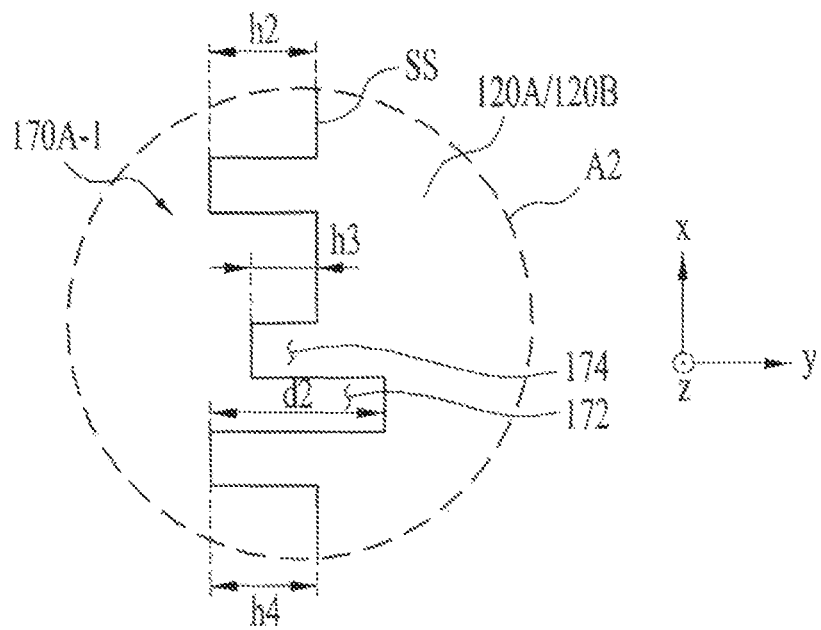
Figure 6C:
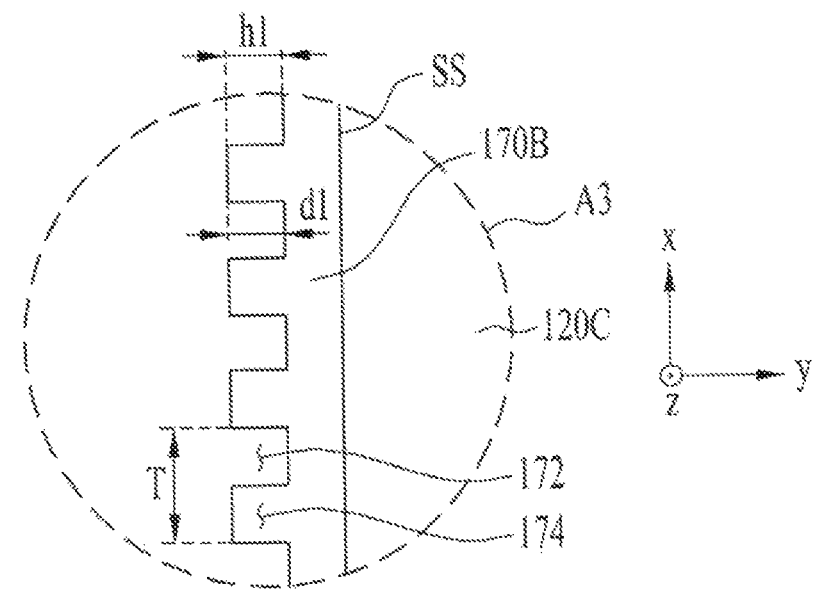

FIGS. 6A to 6C are partial enlarged sectional views illustrating embodiments A1, A2 and A3 of portion "A" illustrated in FIGS. 2, 4 and 5. Here, although the first light diffusion structure 170A-1 will be described by way of example, the same description may be applied to the other light diffusion structures 170A-2, 170A-3 and 170B. For example, FIGS. 6A and 6B may correspond to the partial enlarged views of the light diffusion structure 170A-1 illustrated in FIG. 2 or 4, and FIG. 6C may correspond to the light diffusion structure 170B illustrated in FIG. 5.

As exemplarily illustrated in FIGS. 6A to 6C, the at least one light diffusion structure 170A-1 or 170B may include at least one hole 172 and at least one rod 174 arranged on the light emission surface (e.g., SS) of the lens 120A, 120B or 120C.

As exemplarily illustrated in FIG. 6A or 6C, according to the embodiment A1 or A3, the at least one hole 172 and the at least one rod 174 may be periodically arranged at an interval (or, period) T. Alternatively, as exemplarily illustrated in FIG. 6B, according, to the other embodiment A2, the at least one hole 172 and the at least one rod 174 may be non-periodically arranged in a random manner.

In addition, as exemplarily illustrated in FIG. 6A or 6C, according to the embodiment A1 or A3, the at least one hole 172 may include a plurality of holes 172 having the same depth d1, and the at least one rod 174 may include a plurality of rods 174 having the same height h1. For example, the at least one rod 174 may have a height h1 on the order of tens of μm, for example, 10 μm.

Alternatively, as exemplarily illustrated in FIG. 6B, according to the embodiment A2, the at least one hole 172 may include a plurality of holes 172 having different depths d2, and the at least one rod 174 may include a plurality of rods 174 having different heights h2, h3 and h4.

FIGS. 7A to 7J are partial perspective views illustrating embodiments B1 to B10 of portion "B" in the light diffusion structure 170A-1 illustrated in FIGS. 1 and 2. Although the light diffusion structure formed at the lens 120A illustrated in FIGS. 1 and 2 will be described below, this description may be directly applied to the light diffusion structure 170A or 170B of the lens 120B or 120C illustrated in FIG. 4 or 5.

Figure 7A:
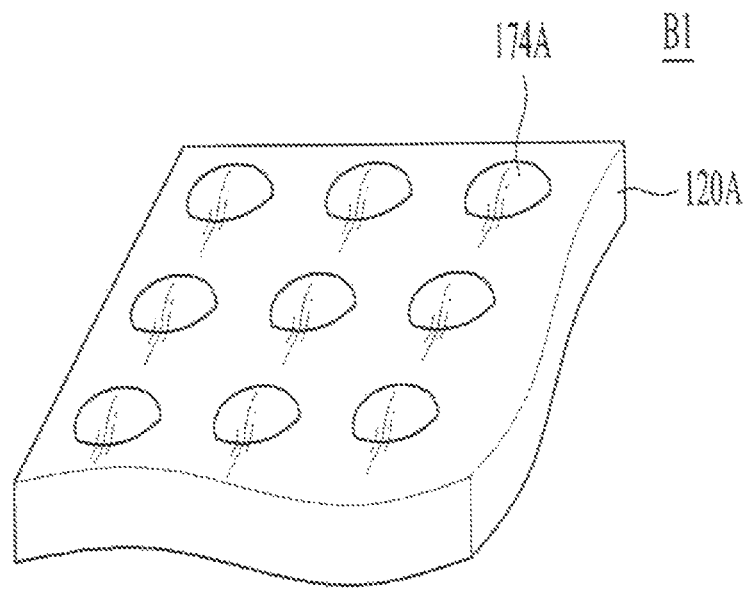
FIGS. 7A to 7J are partial perspective views illustrating embodiments of portion "B" in a light diffusion structure 170A-1 illustrated in FIGS. 1 and 2.
Figure 7B:
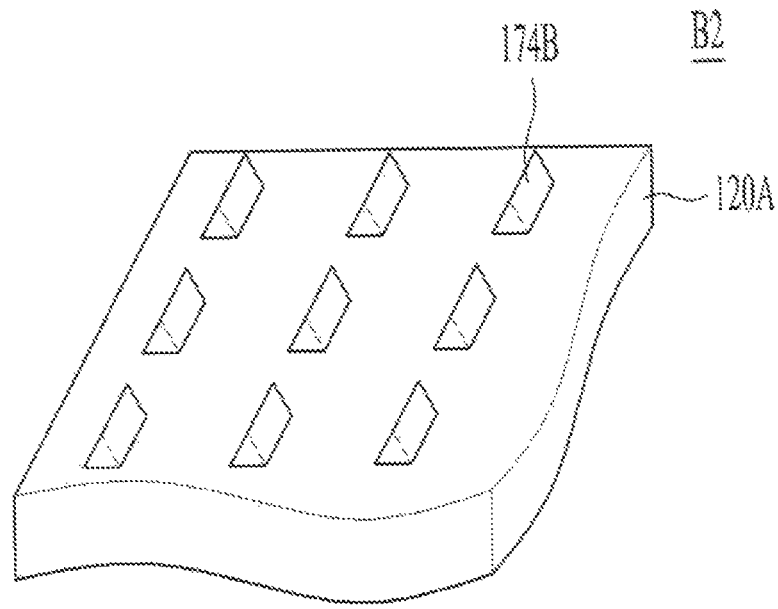
Figure 7C:
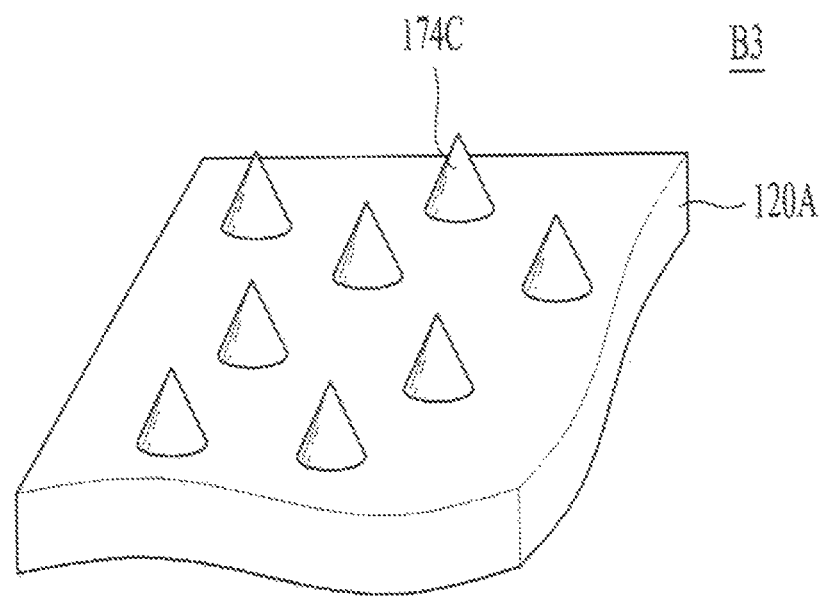
Figure 7D:
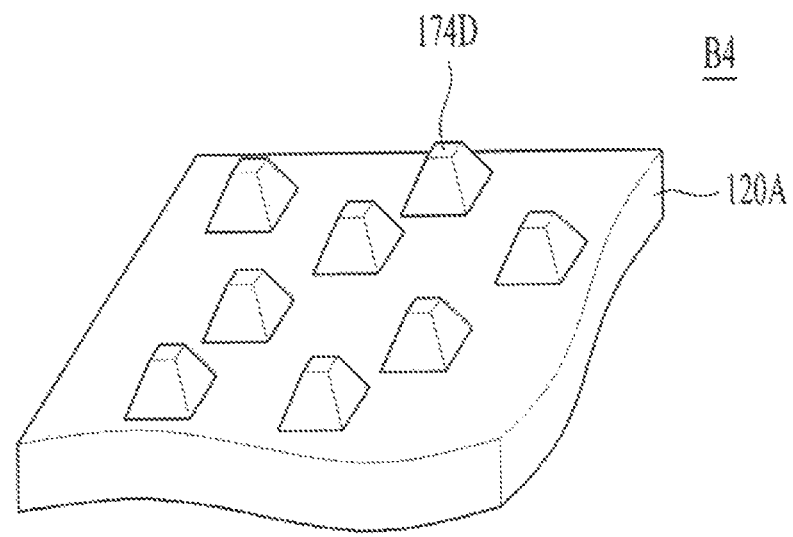
Figure 7E:
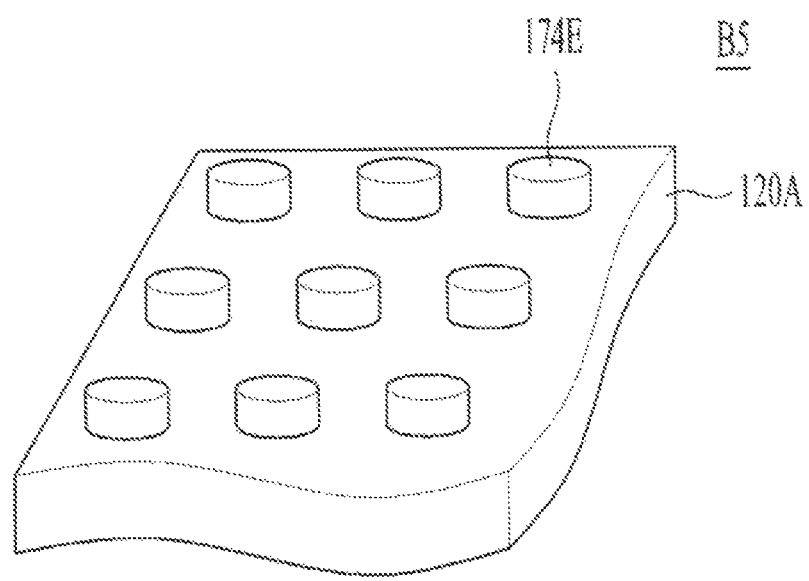
Figure 7F:
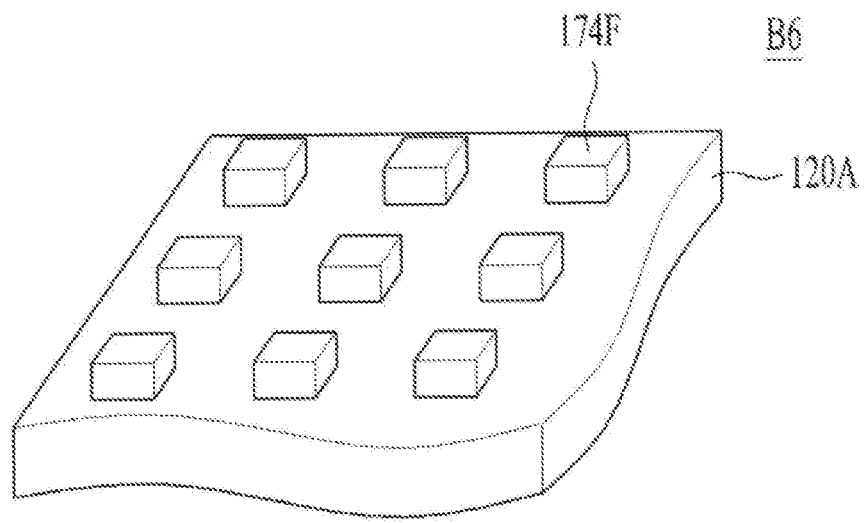

In some embodiments, the light diffusion structure may have a semispherical shape 174A illustrated in FIG. 7A, may have a prism shape (or, a secondary prism shape) 174B illustrated in FIG. 7B, may have a conical shape 174C illustrated in FIG. 7C, may have a truncated shape 174D illustrated in FIG. 7D, may have a cylindrical shape 174E illustrated in FIG. 7E, or may have a cuboidal shape 174F illustrated in FIG. 7F.

Figure 7G:
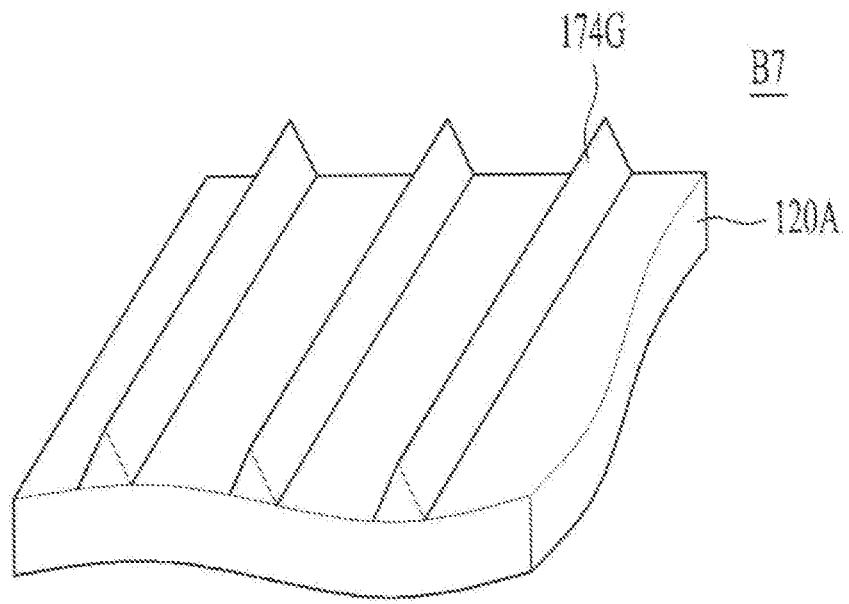
Figure 7H:
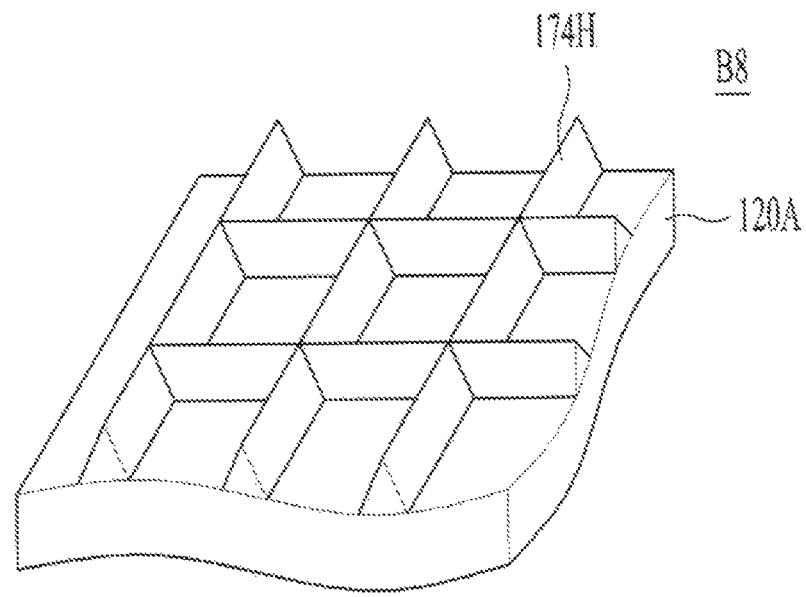
Figure 7I:
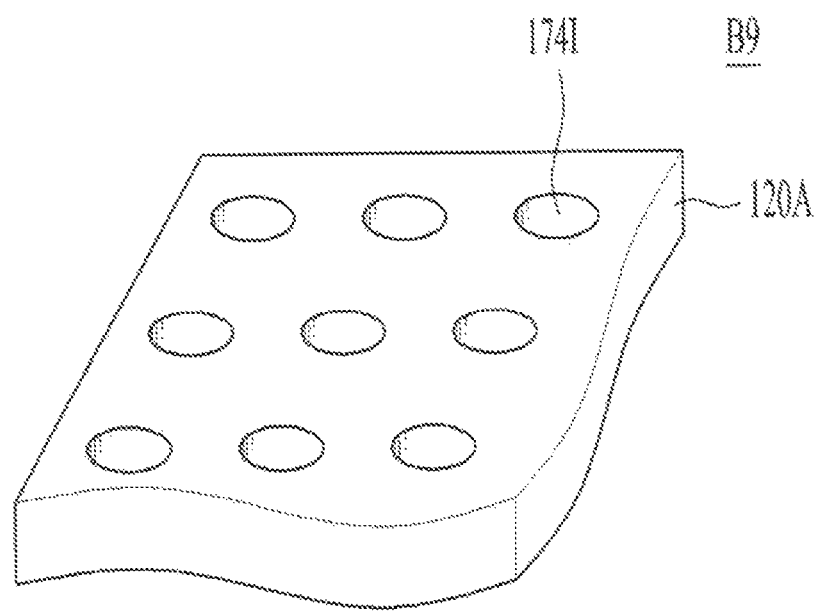

In addition, the light diffusion structure may have a bar shape. For example, although the light diffusion structure illustrated in FIG. 7G is a secondary prism bar shape 174G, embodiments are not limited thereto, and the light diffusion structure may have a cuboidal bar shape or a truncated bar shape, for example.

In addition, the light diffusion structure may have a lattice shape. For example, although the light diffusion structure illustrated in FIG. 7H may have a secondary prism lattice shape 174H, embodiments are not limited thereto, and the light diffusion structure may have a cuboidal lattice shape or a truncated lattice shape, for example.

In addition, although the light diffusion structures 174A to 174H illustrated in FIGS. 7A to 7H have an embossed shape, the light diffusion structure may have an engraved shape. For example, as exemplarily illustrated in FIG. 7I, the light diffusion structure may have a cylindrical engraved shape 174I.

Figure 7J:
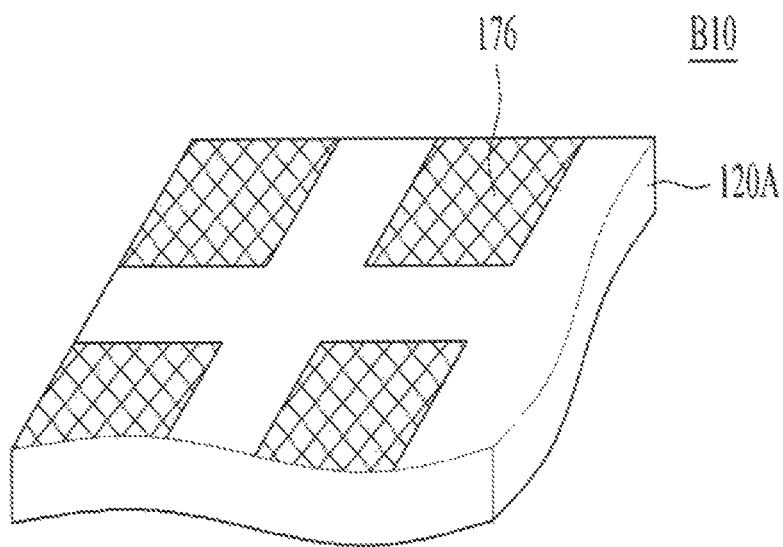

In the case of the embodiment B10 illustrated in FIG. 7J, a rough surface 176 having a given pattern may be placed as the light diffusion structure 170A-1. In this case, although the rough surface 176 is illustrated as having a square shape, embodiments are not limited thereto. That is, in another embodiment, the rough surface 176 may have a polygonal, circular, or elliptical shape, other than the square shape.

In addition, as exemplarily illustrated in FIGS. 7A, 7B, and 7E to 7J, the light diffusion structures B1, B2, B5 to B10, and 170A-1 may have a given pattern (or, constant pattern). That is, the rods 174A, 174B, and 174E to 174J of the light diffusion structure 170A-1 may be spaced apart from each other by a constant distance so as to be periodically arranged. Alternatively, as exemplarily illustrated in FIGS. 7C and 7D, the light diffusion structure 170A-1 may have a random pattern. That is, the rods 174C and 174D of the light diffusion structure 170A-1 may be spaced apart from each other by irregular distances so as to be non-periodically arranged.

In addition, although not illustrated, the light diffusion structure may be the combination of a plurality of shapes illustrated in FIGS. 7A to 7J.

The arrangement position or shape of the light diffusion structure described above may be selected based on the size of the lens 120A, 120B or 120C.

In addition, the diffuser 170A, 170B, or 180 described above may comprise a material having transmittance or reflectance to reduce color deviation.

In addition, although the light-emitting device packages 100A, 100B and 1000 illustrated in FIGS. 2, 4 and 5 are illustrated as including all of the light diffusion structure 170A, 170A or 170B and the light dispersing agent 180 which, constitute the diffuser, embodiments are not limited thereto. That is, in another embodiment, the light-emitting device package 100A, 100B or 100C may include only the light dispersing agent 180, or may include only the light diffusion structure 170A, 170A, or 170B as the diffuser.

Meanwhile, the fluorescent substance 130A or 130B may be disposed on the light source 110.

In one embodiment, as exemplarily illustrated in FIG. 2 or 5, the fluorescent substance 130A may be disposed to surround the light source 110. The lower surface of the lens 120A or 120C may be divided into first, second, and third segments S1, S2 and S3. In this case, the fluorescent substance 130A may include a first fluorescent portion located at the first segment S1, a second fluorescent portion located at the second segment S2, and a third fluorescent portion located at the third segment S3.

The first fluorescent portion may be disposed between the first lower surface of the lens 120A or 120C and the upper surface 110-1 of the light source 110. Here, the first lower surface of the lens 120A or 120C means the lower surface that is located at the first segment S1 among the lower surface of the lens 120A or 120C.

The second fluorescent portion may extend from the first fluorescent portion, and may be disposed between the side surface 110-2 of the light source 110 and the second lower surface of the lens 120A or 120C. Here, the second lower surface of the lens 120A or 120C may mean the lower surface that faces the side surface 110-2 of the light source 110 among the lower surface of the lens 120A or 120C. That is, the second fluorescent portion may be disposed between the third lower surface of the lens 120A or 120C and the second lead frame 144. When the light source 110 is disposed on the first lead frame 142, the second fluorescent portion may be disposed between the second lower surface of the lens 120A or 120C and the first lead frame 142. Here, the third lower surface of the lens 120A or 120C may be the lower surface located between the first lower surface and the second lower among the lower surfaces of the lens 120A or 120C, i.e. the lower surface located at the second segment S2, and may be located in the same horizontal plane as the first lower surface.

The third fluorescent portion may extend from the second fluorescent portion, and may be disposed under the fourth lower surface of the lens 120A or 1200. Here, the fourth lower surface of the lens 120A or 120C may mean the lower surface which is located at the third segment S3 among the lower surface of the lens 120A or 120C. At this time, the third fluorescent portion may be disposed to vertically overlap the light diffusion structure 170A-1 or 170B. This serves to allow light diffused by the light diffusion structure 170A-1 or 170B to easily collide with phosphors included in the fluorescent substance 130A.

In another embodiment, unlike the fluorescent substance 130A illustrated in FIG. 2 or 5 including the first, second, and third fluorescent portions, the fluorescent substance 130E illustrated in FIG. 4 may be disposed between the lower surface of the lens 120B and the light source 110. In this case, the fluorescent substance 130B may be disposed under the entire flat lower surface of the lens 120B.

In addition, the fluorescent substance 130A or 130B may have an even thickness or an uneven thickness. Referring to FIG. 2, the first to third fluorescent portions of the fluorescent substance 130A may have even or uneven first to third thicknesses t1 to t3. In addition, referring to FIG. 4, the fluorescent substance 130B may have an even or uneven fourth thickness t4.

When the first to fourth thicknesses t1 to t4 of the fluorescent substance 130A or 130B are uneven, color deviation may worsen. However, the light-emitting device packages 100A, 100B and 100C according to the embodiments include the light diffusion structure 170A-1, 170A or 170B, thus being capable of reducing color deviation.

In addition, the first width W1 of the lens 120A, 120B or 120C and the second width W2 of the fluorescent substance 130A or 130B which emits light to the lens 120A, 120B or 120C may be substantially the same. Here, the second width W2 may mean the width of the fluorescent substance 130A or 130B in the direction (e.g., the y-axis perpendicular to the light axis LA) crossing the light axis LA. Although the second width W2 may be 30 mm, embodiments are not limited thereto.

In addition, although the fluorescent substance 130A or 130B described above may be applied via spraying, embodiments are not limited as to the method for forming the fluorescent substance 130A or 130B.

Although not illustrated, the light-emitting device package 100A illustrated in FIG. 2 may include only the light diffusion structure 170A or 170B illustrated in FIG. 4 or 5, instead of the light diffusion structure 170A-1. In addition, the light-emitting device package 100B illustrated in FIG. 4 may include the light diffusion structure 170A-1 or 170B illustrated in FIG. 2 or 5, instead of the light diffusion structure 170A. In addition, the light-emitting device package 100C illustrated in FIG. 5 may include the light diffusion structure 170A-1 or 170A illustrated in FIG. 2 or 4, instead of the light diffusion structure 170B.

Referring to FIGS. 2, 4 and 5, when the diffuser 170A-1, 170A, 170B or 180 according to the embodiments are not provided, color deviation, in which the color of light emitted through the center of the upper surface US of the lens 120A, 120B or 120C and the color of light emitted through the corner surface CS or the side surface SS of the lens 120A, 120B or 120C are separated, may occur. This is because the number of times the light emitted through the upper surface US of the lens 120A, 120B or 120C hits the fluorescent substance 130A or 130B and the number of times the light emitted through the corner surface CS or the side surface SS of the lens 120A, 120B or 120C hits the fluorescent substance 130A or 130B may be different, or because the light may not be emitted in an evenly mixed state. To solve this problem, the light-emitting device package 100A, 100B and 100C according to the embodiments include the diffuser 170A-1, 170A, 170B or 180 which serve to diffuse light to at least one of the interior or the light emission surface of the lens 120A, 120B or 120C.

According to the embodiments, as the diffuser 170A-1, 170A, 170B or 180 provides the light emission surface US, CS or SS of the lens 120A, 120B or 120C with diffusion effects, it is possible not only to adjust the number of times the light hits the fluorescent substance 130A or 130B but also to ensure even mixing of the light at the light emission surface US, CS and SS of the lens 120A, 120B or 120C, which may reduce color deviation. That is, the diffuser 170A-1, 170A, 170B or 180 serves to change the number of recycling times of light inside the lens 120A, 120B or 120C and to perform the mixing of light emitted out of the lens 120A, 120B or 120C. In this way, color deviation may be reduced.

In addition, in order to adjust color deviation or color temperature, at least one of the size, shape, or installation position of the aforementioned light diffusion structure 170A-1, 170A and 170B, the roughness of the rough surface, or the density of the light dispersing agent 180 may be determined based on at least one of the ratio of the first width W1 to the height H of the lens 120A, 120B or 120C, the kind, amount, installation position or shape of the fluorescent substance 130A or 130B. However, embodiments are not limited. That is, according to another embodiment, in order to prevent color deviation, the position of the light source 110 or the position of the fluorescent substance 130A or 130B may not be limited.

That is, whether to arrange the light diffusion structure 170A-1, 170A or 170B described above on any one of the upper surface US, the side surface SS, and the corner surface CS of the lens 120A, 120B or 120C, whether to arrange the light diffusion structure 170A-1, 170A or 170B on the entire side surface SS or a portion of the side surface SS, and whether to arrange the light diffusion structure 170A-1, 170A or 170B on any one of an upper portion, a lower portion, or a middle portion of the side surface SS if the light diffusion structure 170A-1, 170A or 170B is arranged a portion of the side surface SS may be determined based on the extent or position of occurrence of color deviation.

Figure 8A:
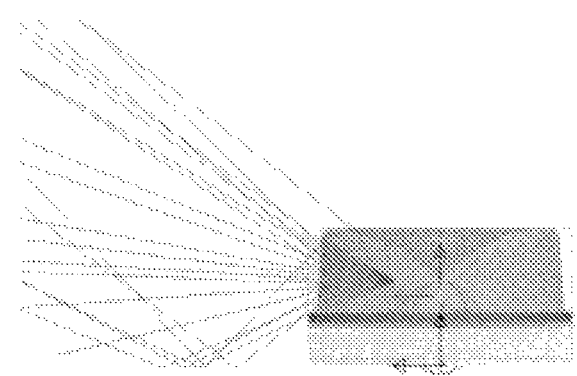
FIGS. 8A and 8B are views illustrating a movement path along which light is emitted from each of a light-emitting device package including no diffuser according to a comparative embodiment and a light-emitting device package including a diffuser according to an embodiment.
Figure 8B:
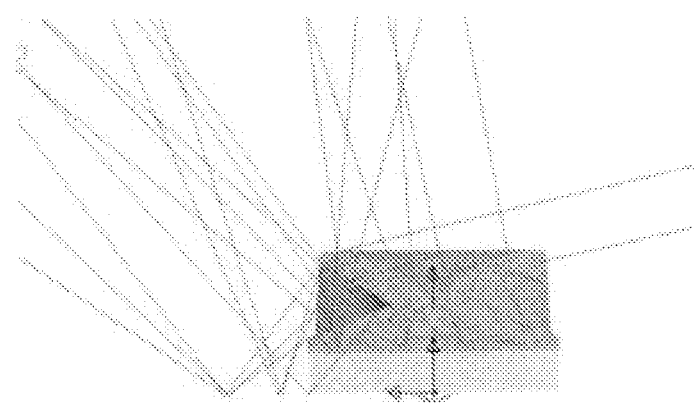

FIGS. 8A and 8B are views illustrating a movement path along which light is emitted from each of a light-emitting device package including no diffuser according to a comparative embodiment and a light-emitting device package including a diffuser according to an embodiment.

When comparing the shape of light emitted from the side surface SS, the upper surface US and the corner surface CS of the light-emitting device package according to the comparative embodiment illustrated in FIG. 8A with the shape of light emitted from the side surface SS, the upper surface US and the corner surface CS of the light-emitting device package according to the embodiment illustrated in FIG. 8B, it can be appreciated that the embodiment exhibits more even emission of light through the side surface SS and the upper surface US compared to that of the comparative embodiment. This is because the light is diffused and mixed in the diffuser. Accordingly, it can be appreciated from FIGS. 8A and 8B that color deviation may be reduced via the mixing of light.

In addition, color deviation may be reduced or increased according to the reflectance or transmittance of the light diffusion structure 170A-1, 170A or 170B. That is, the higher the reflectance of the light diffusion structure 170A-1, 170A or 170B, the greater the number of times light introduced into the side surface SS of the lens 120A, 120B or 120C undergoes total internal reflection. Thereby, the total-reflected light may again hit the fluorescent substance 130A or 130B so that the number of times the light hits the fluorescent substance 130A or 130B increases, thereby reducing the color temperature and the color deviation. For example, the color temperature may shift to a yellow region. Generally, a great amount of the fluorescent substance 130A or 130B is necessary in order to reduce the color temperature. However, according to embodiments, the color temperature may be reduced without needing to increase the amount of the fluorescent substance 130A or 130B thanks to the provision of the diffuser 170A-1, 170A, 170B or 180. For example, the color temperature may be reduced from 4500K to 4000K, a reduction of 500K.

Figure 9A:
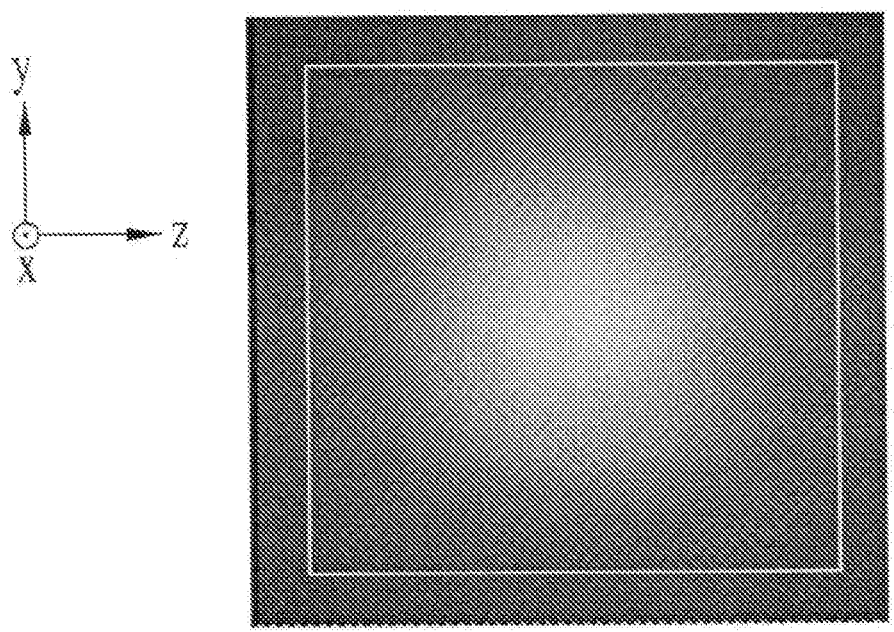
FIGS. 9A and 9B are views illustrating, an image and a CCT of the light-emitting device package including no diffuser according to the comparative embodiment.
Figure 9B:
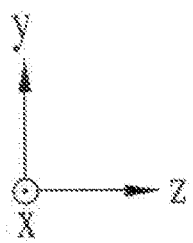
Figure 9B:
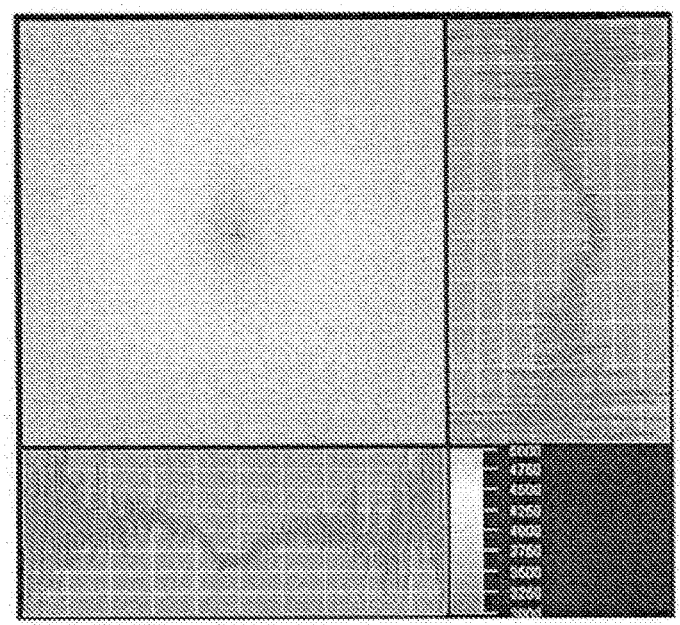
Figure 10A:
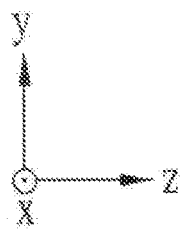
FIGS. 10A and 10B are views illustrating an image and a CCT of the light-emitting device package including the diffuser according to the embodiment.
Figure 10A:
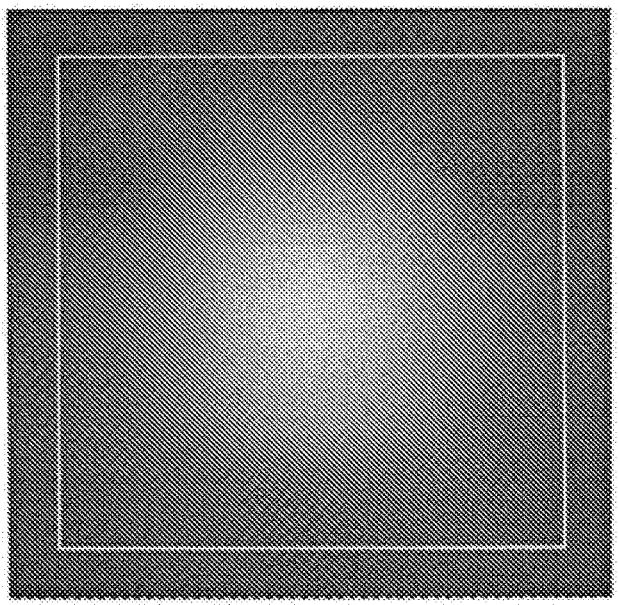
Figure 10B:
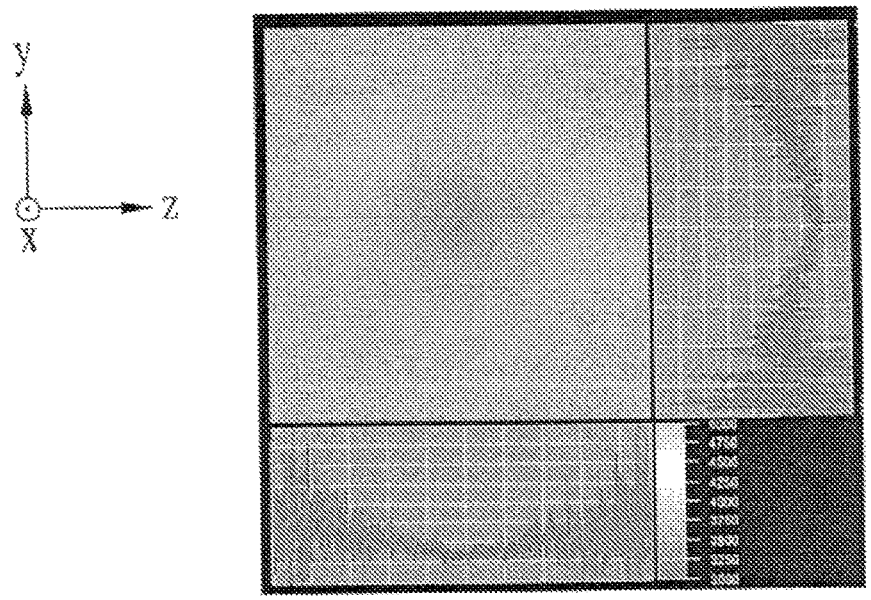

FIGS. 9A and 9B are views illustrating an image and the Correlated Color Temperature (CCT) of the light-emitting device package including no diffuser according to the comparative embodiment, respectively, and FIGS. 10A and 10B are views illustrating an image and the CCT of the light-emitting device package including the diffuser according to the embodiment, respectively.

Referring to FIGS. 9A and 9B, it can be appreciated that color deviation asymmetry between the y-axis and the z-axis is severe when using the light-emitting device package according to the comparative embodiment. For example, color deviation between the top center of the lens and the periphery of the lens may be approximately 500K. In addition, in the case of the comparative embodiment, the average color temperature may be 4000K.

On the other hand, referring to FIGS. 10A and 10B, it can be appreciated that color deviation asymmetry between the y-axis and the z-axis is considerably reduced when using the light-emitting device package according to the embodiment, compared to FIGS. 9A and 9B. For example, color deviation between the top center of the lens and the periphery of the lens (e.g., the corner surface or the side surface) may be approximately 250K. That is, it can be appreciated that color deviation is reduced by half compared to FIGS. 9A and 9B. In addition, in the case of the embodiment, it can be appreciated that the average color temperature is 3600K and that the CCT is reduced by about 400K.

Generally, it is more difficult to reduce color deviation in the case where the light-emitting device packages 100A and 100C illustrated in FIGS. 2 and 5 are of an integral type than in the case where the light-emitting device package 100B is of a separated type as illustrated in FIG. 4. However, the light-emitting device packages 100A, 100B and 100C according to the embodiments including the diffuser 170A-1, 170A, 170B or 180 may reduce color deviation regardless of whether the light-emitting device package is of an integral type or a separated type.

Hereinafter, a light-emitting module according to an embodiment will be described with reference to the accompanying drawings.

Figure 11:
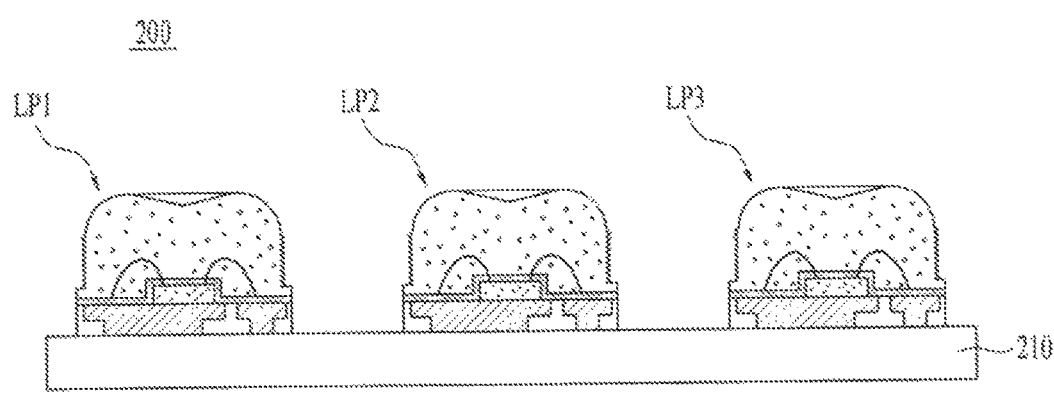
FIG. 11 is a schematic sectional view of a light-emitting module according to an embodiment.

FIG. 11 is a schematic sectional view of a light-emitting module 200 according to an embodiment.

Referring to FIG. 11, the light-emitting module 200 may include a module board 210 and a plurality of light-emitting device packages LPI to LPK (here, K is a positive integer of 2 or more). FIG. 11 illustrates the case where The light-emitting device packages LP1 to LP3 may be arranged on the module board 210. The module board 210 may include a Printed Circuit Board (PCB), a metal core PCB, a flexible PCB, or the like, and embodiments are not limited thereto.

The light-emitting device packages LP1 to LP3 are mounted on the module board 210 so as to be spaced apart from one another. Each of the light-emitting device packages LP1 to LP3 correspond to the light-emitting device package illustrated in FIG. 1, 2, 4 or 5, and thus a repeated description thereof will be omitted below.

A plurality of light sources 110 may be arranged on the module board 210. Each of the light sources 110 may correspond to the light source 110 illustrated in FIG. 2, 3A to 3C, 4 or 5.

A plurality of lenses 120 is respectively arranged on the light sources 110. The lenses 120 may correspond to the lens 120A, 120B or 120C illustrated in FIG. 1, 2, 4 or 5.

At this time, the diffuser may be disposed on the light emission surface, i.e. at least one of the upper surface US, the side surface SS, or the corner surface CS of the lens 120. The diffuser may include at least one of the light diffusion structure 170A-1, 170A or 170B or the light dispersing agent 180 illustrated in FIGS. 2, 4 and 5.

Optical members such as, for example, a light guide plate, a prism sheet, a diffuser sheet, and a fluorescent sheet may be arranged in the path of light emitted from the light-emitting device packages according to the embodiments. In addition, the light-emitting device package or the light-emitting module described above may be applied to various fields. For example, the light-emitting device package or the light-emitting module may function as a backlight unit or a lighting unit. For example, the lighting unit may include an indicator device, a lamp, or a streetlight. In particular, the lighting unit may be applied to a decorative lighting appliance for emotional, for example, a wall washer which is capable of uniformly illuminating a wall surface. In this case, according to the embodiments, color deviation may be prevented, which enables the lighting appliance to be realized using a reduced number of light sources compared to the related art.

As is apparent from the above description, a light-emitting device package and a light-emitting module including the same according to the embodiments may prevent color deviation by causing the color of light emitted through the top center of the lens and the color of light emitted through the corner to be the same, and may tune a CCT within the limited density range of a fluorescent substance.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light-emitting device package comprising:
   a light source;
   a lens disposed on the light source; and
   a diffuser located on the interior of the lens and a light emission surface of the lens, so as to diffuse light,
   wherein the diffuser includes:
   a light dispersing agent disposed to be distributed in the interior of the lens; and
   at least one light diffusion structure located on at least one of the outside or the inside of the light emission surface of the lens,
   wherein the light diffusion structure includes a rough surface formed on the light emission surface of the lens,
   wherein the light diffusion structure includes at least one hole and at least one rod located at the light emission surface of the lens, and
   wherein the at least one hole includes a plurality of holes having different depths, and the at least one rod includes a plurality of rods having different heights.

2. The package according to claim 1, wherein the rough surface has a roughness within a range of 3 μm to 15 μm rms.

3. The package according to claim 1, wherein the hole and the rod are periodically arranged.

4. The package according to claim 1, wherein the hole and the rod are non-periodically arranged in a random manner.

5. The package according to claim 1, wherein the rod has at least one shape selected from among a semispherical shape, a prism shape, a conical shape, a truncated shape, a polyhedral shape, a bar shape, and a lattice shape, or combinations thereof.

6. The package according to claim 1, wherein the rod has a height of 10 μm.

7. The package according to claim 1, wherein the light diffusion structure is located on at least a portion of a side surface of the lens, the side surface being the light emission surface.

8. The package according to claim 1, wherein the light diffusion structure is integrated with the lens and is a portion of the lens.

9. The package according to claim 1, wherein the light diffusion structure is attached or applied to the lens.

10. The package according to claim 1, further comprising a fluorescent substance disposed between a lower surface of the lens and the light source.

11. The package according to claim 10, wherein the fluorescent substance includes:
a first fluorescent portion disposed between a first lower surface of the lens and an upper surface of the light source;
a second fluorescent portion extending from the first fluorescent portion, the second fluorescent portion being disposed between a second lower surface of the lens and a side surface of the light source; and
a third fluorescent portion extending from the second fluorescent portion, the third fluorescent portion being disposed under a third lower surface of the lens, and
wherein the lower surface of the lens includes the first, second, and third lower surfaces.

12. The package according to claim 11, wherein the third fluorescent portion is located so as to overlap the light diffusion structure in a vertical direction.

13. The package according to claim 10, wherein the fluorescent substance and the lens have the same width.

14. The package according to claim 1, wherein the lens has a width different from a height thereof.

15. The package according to claim 1, wherein the light source is located in a recess formed in the lens.

16. The package according to claim 1, further comprising:
first and second lead frames; and
an insulator disposed between the first and second lead frames, so as to electrically insulate the first and second lead frames from each other.

17. A light-emitting module comprising:
a module board;
a plurality of light sources arranged on the module board;
a plurality of lenses arranged respectively on the light sources; and
a diffuser located on the interior and a light emission surface of the respective lens, so as to diffuse light,
wherein the diffuser includes:
a light dispersing agent disposed to be distributed in the interior of the lens; and
at least one light diffusion structure located on at least one of the outside or the inside of the light emission surface of the lens,
wherein the light diffusion structure includes a rough surface formed on the light emission surface of the lens,
wherein the light diffusion structure includes at least one hole and at least one rod located at the light emission surface of the lens, and
wherein the at least one hole includes a plurality of holes having different depths, and the at least one rod includes a plurality of rods having different heights.

* * * * *